United States Patent
Sargent

(10) Patent No.: US 7,522,393 B2
(45) Date of Patent: Apr. 21, 2009

(54) FAULT CURRENT LIMITER

(75) Inventor: Philip M Sargent, Cambridge (GB)

(73) Assignee: Rolls-Royce plc, London (GB)

( * ) Notice: Subject to any disclaimer, the term of this patent is extended or adjusted under 35 U.S.C. 154(b) by 0 days.

(21) Appl. No.: 11/600,147

(22) Filed: Nov. 16, 2006

(65) Prior Publication Data

US 2007/0139833 A1    Jun. 21, 2007

Related U.S. Application Data

(63) Continuation of application No. PCT/GB2005/001897, filed on May 18, 2005.

(30) Foreign Application Priority Data

May 18, 2004    (GB)    ................... 0411035.9

(51) Int. Cl.
*H02H 7/00* (2006.01)
*H02H 9/00* (2006.01)
(52) U.S. Cl. .................. 361/19; 361/93.1; 361/93.9
(58) Field of Classification Search .................. 361/19, 361/93.1, 93.9; 174/251.1
See application file for complete search history.

(56) References Cited

U.S. PATENT DOCUMENTS

| | | | | |
|---|---|---|---|---|
| 4,814,235 A | * | 3/1989 | Hecht et al. | ............ 428/586 |
| 4,943,792 A | * | 7/1990 | Srivastava et al. | ........... 335/216 |
| 5,761,017 A | | 6/1998 | Hodge | |
| 6,192,969 B1 | * | 2/2001 | Bunn et al. | ............ 164/122.1 |
| 6,255,595 B1 | * | 7/2001 | Metra et al. | ............ 174/125.1 |
| 6,522,236 B1 | * | 2/2003 | Ries | ............ 338/13 |
| 6,958,893 B2 | * | 10/2005 | Yuan | ............ 361/19 |
| 7,009,104 B2 | * | 3/2006 | Spreafico | ............ 174/15.5 |
| 2003/0154734 A1 | | 8/2003 | Paul | |

FOREIGN PATENT DOCUMENTS

| | | |
|---|---|---|
| CA | 2 326 058 A | 6/2001 |
| DE | 4 418 050 A | 1/1995 |
| DE | 198 56 425 A | 7/1999 |
| DE | 100 14 197 A | 9/2001 |
| EP | 0 464 679 A | 1/1992 |
| EP | 1 217 708 A | 6/2002 |
| EP | 1 396 866 A | 6/2002 |
| WO | WO 2004004019 A | 1/2004 |

* cited by examiner

*Primary Examiner*—Stephen W Jackson
*Assistant Examiner*—Zeev Kitov
(74) *Attorney, Agent, or Firm*—W. Warren Taltavull; Manelli Denison & Selter PLLC

(57) ABSTRACT

A conductor element for a superconducting FCL has an elongate superconducting element 18 surrounded by bodies 26a, 26b, which form a thermal mass around the element 18. The thermal mass is in thermal connection with a cooling system, such as a cryogenic system. The bodies 26a, 26b are solid, for example copper. The thermal mass maintains even temperature along the element 18, to improve fault response and recovery. Cooling functions are provided externally of the conductor element and may be by means of conventional cryogenic cooling systems. The element is free of cryogens and robust.

17 Claims, 2 Drawing Sheets

FAULT CURRENT LIMITER

This is a continuation of International Application No. PCT/GB2005/001897 filed May 18, 2005, designating United States.

FIELD OF THE INVENTION

Embodiments of the present invention relate to fault current limiters (FCLs). In particular, they relate to FCLs which use superconductors as part of a device for limiting the fault current in electrical power apparatus and networks.

BACKGROUND OF THE INVENTION

When a fault or short-circuit occurs in an electric power system, a short and intense current flows. This is termed the "fault current" and it may be 20 to 50 times the usual operating current. These fault currents damage equipment and cabling. A superconducting fault current limiter uses an inherent property of superconductors to limit the fault current to a much lower level, typically 10 times the operating current.

FCLs are a well-known application of high temperature (copper-oxide ceramic) superconductors operating in liquid nitrogen. Almost without exception, existing FCLs use liquid boiling as a means of removing heat from the superconductor. A typical example is the device being produced by Nexans SuperConductors for the United States Department of Energy development project that began in 2003.

There is one design which uses gas cooling: "A Nitrogen Gas Cooled, Hybrid, High Temperature Superconducting Fault Current Limiter" by M. Steurer, H. Brechna and K. Frohlich of the Swiss Federal Institute of Technology ETH, CH-8092 Zurich, Switzerland, IEEE Trans. Appl. Supercond., Vol. 10, No. 1, pages 840-844, 2000. However this design essentially requires a "fast acting load switch" in parallel with the superconducting element. Thus the superconducting element in their design is not the element that detects and triggers the current limiting behaviour, only actuates it on being triggered, and their design has inadequate cooling capability for continuous operation of the superconducting element.

There are also non-superconducting FCLs based on entirely different silicon thyristor technologies.

FCLs have been designed for both direct current (DC) and alternating current (AC) operation. The most common use is anticipated to be in AC power systems operating at 60 Hz or 50 Hz. Aircraft systems at 400 Hz are also possible. In an AC system, the fault that creates the highest fault current is one that occurs when the AC half-cycle is near its maximum. The rise time for a half-cycle for a 50 Hz AC power system is 5 milliseconds. This is typically taken as the fault initiation time for FCL design as the inductance of the system being protected prevents much faster rise times.

The recovery time for an FCL is typically longer than that of the fault initiation time. Recovery times of between 5 milliseconds and several hours have been discussed in the published literature. On recovery, the FCL carries the usual operating current.

The fault repeat time is the time after recovery before an FCL can handle another fault without damage or without creating a permanent open circuit limited only by the external shunt and the internal normal resistance.

Many designs of FCL in the published literature have a limit to the number of faults they can handle within a period of hours or days without damage or without creating a permanent open circuit. This is equivalent to the recovery time increasing towards infinity or the time to repair.

SUMMARY OF THE INVENTION

The present invention provides a conductor element for a fault current limiter, comprising:

a superconducting element which quenches to a normal conducting state when at least one of the current density and temperature is excessive; and a thermal mass in thermal contact with the superconducting element;

wherein the thermal mass is provided by at least one body in solid form;

and wherein the element further comprises a connection arrangement for providing, in use, thermal connection between the thermal mass and a cooling system.

The superconducting element is preferably elongate, the body or bodies being located around the element. The thermal mass may comprise a plurality of bodies forming a plurality of layers around the superconducting element. The or each layer of the mass may comprise a plurality of bodies at respective positions around the element. Preferably, the or each layer of the mass comprises a plurality of bodies at respective positions along the element. Adjacent bodies of the thermal mass are preferably in thermal contact. A body of electrically insulating material is preferably provided between adjacent bodies.

Preferably an additional body of thermally conducting material is provided in thermal contact with the superconducting element in the vicinity of boundaries between bodies of the thermal mass, to reduce the likelihood of hot spots occurring in the superconducting element at that vicinity.

Resistors may be provided between adjacent bodies to bridge the electrically insulating material.

Preferably, the or at least one of the bodies is of copper, which may be oxygen-free, high conductivity copper.

The thermal mass is preferably provided within a distance from the superconducting element of no more than three times the characteristic thermal distance within the material of the thermal mass.

The conductor element is preferably arranged in serpentine manner across a surface which, in use, is in thermal contact with the cooling system.

The element may comprise at least one coil connected in parallel with all or part of the superconducting element and coiled around the superconducting element. There may be a plurality of coils as aforesaid. Each of the coils may be connected in parallel with a respective part of the length of the superconducting element.

The invention also provides a fault current limiter, comprising:

1. connection terminals for connecting the limiter in circuit;
2. a conductor element according to any of the previous definitions, connected between the connection terminals; and
3. a cooling system which, in use, cools the thermal mass of the conductor element.

Preferably, the limiter has a shunt resistance connected in parallel with the conductor element between the terminals and having a resistance lower than the conductor element when the superconducting element of the conductor is quenched.

BRIEF DESCRIPTION OF THE DRAWINGS

Embodiments of the present invention will now be described in more detail, by way of example only, and with reference to the following drawings, in which.

DETAILED DESCRIPTION OF THE INVENTION

Figure 1:
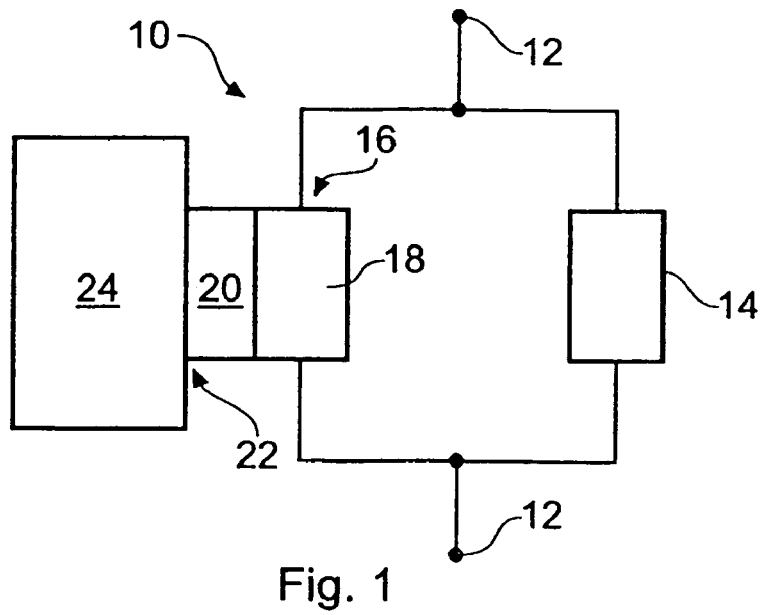
FIG. 1 is a schematic overview showing a conductor element of the present invention, in use in a fault current limiter.

Embodiments of the present invention may be used as the superconducting thermal element of many types of superconducting fault current limiter, such as direct, indirect, resistive, magnetic or combined arrangements. FIG. 1 schematically illustrates the manner of use.

FIG. 1 illustrates an FCL 10 for use in limiting fault current flowing between terminals 12. In this example, two parallel conducting paths are provided between the terminals 12. One path is through a shunt resistor 14. The other is through a conductor element 16, which embodies the present invention. The element 16 comprises a superconducting element 18 which will quench from its superconducting state to a normal conducting state when either the current density or the temperature (or both) becomes excessive. The element 16 also includes a thermal mass 20 which is in thermal contact with the superconducting element 18. The thermal mass 20 is provided by at least one body (to be described) which is in solid form. The element 16 further comprises a connection arrangement at 22 for providing, in use, thermal connection between the thermal mass 20 and a cooling system 24.

In another example, the resistance of the quenched superconducting element 18 may be used to carry fault current, if sufficient cooling is available.

Figure 2:
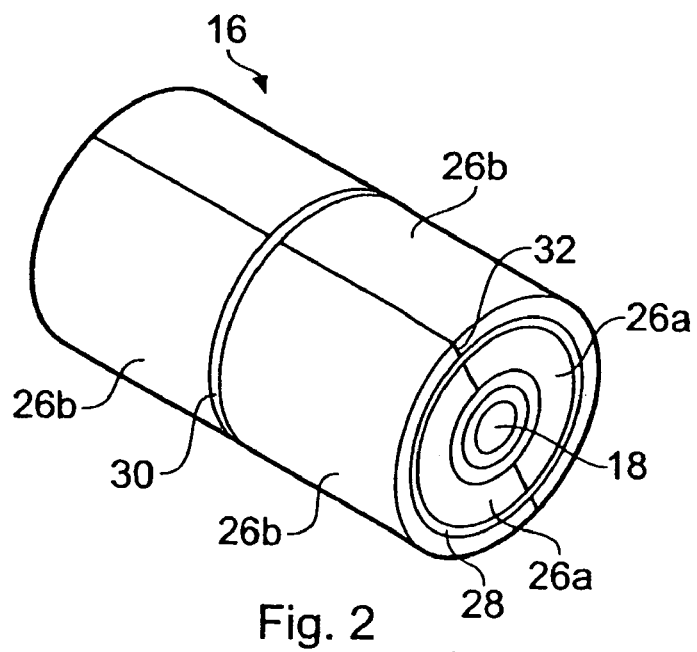
FIG. 2 is a schematic perspective view of part of the conductor element.

FIG. 2 illustrates the conductor element in more detail. In this example, the conductor element is generally cylindrical in form, having an elongate superconducting element 18 extending generally along the cylinder axis, there being bodies 26a, 26b of the thermal mass 20, located around the element 18. The thermal mass 20 comprises a plurality of bodies 26a, 26b forming a plurality of layers around the element 18. That is, bodies 26a form an inner layer around the element 18; bodies 26b form an outer layer. Each layer includes several bodies at respective positions around the element and several bodies at respective positions along the element. Boundaries exist between adjacent bodies 26, and electrically insulating material is provided between adjacent bodies 26, at these boundaries. Thus, a cylinder of insulating material 28 is provided between the layers 26a, 26b. Annular or disk-like bodies 30 are provided between bodies of the same layer, separated along the element 18. Sheets 32 of insulating material extend radially out from the superconducting elements 18, between adjacent bodies 26.

The insulation material 28, 30, 32 may be provided as an insulating film of polymer lacquer or another material. It is to be understood that whenever the terms "insulator" or "insulating material" or the like are used in this specification, the terms should be understood to include highly resistive material.

Adjacent bodies 26 are in thermal contact with each other, through the insulating material 28, 30, 32.

The bodies 26 are of a material having a high thermal diffusivity at the operating temperature. The successive layers may be of different or similar thermal diffusivity. Separation of the layers by insulating material 28 helps reduce eddy currents during use and may assist during manufacture. The insulating material also prevents the bodies 26 reducing the resistance of the element 16, when the element 18 is quenched. In one example, the innermost layer 26a may be of oxygen-free high conductivity (OFHC) copper, the outer layer 26b being of less highly conducting copper.

Figure 3:
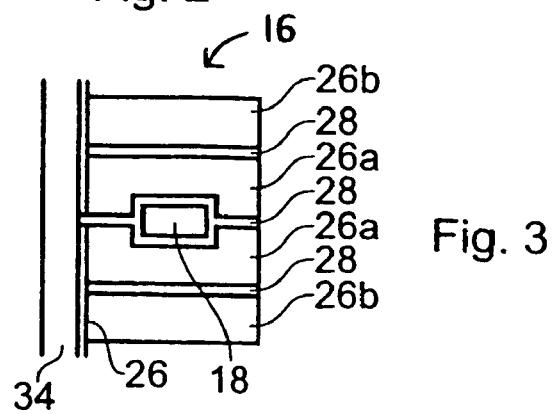
FIG. 3 is a section through an alternative form of conductor element.

FIG. 3 shows an alternative embodiment in which the superconducting element 18 is in the form of a superconducting tape and lies centrally in a laminated structure which includes two thick strips 26a of OFHC copper, and two further strips 26b of less highly conducting copper. These are separated by electrical insulation at 28. In the arrangements of FIG. 2 or 3, at least the outermost layer of bodies 26 is affixed to a thermally conducting support 34 (not shown in FIG. 2), which provides for thermal connection, in use, between the bodies 26 of the thermal mass 20, and the cooling system 24, which is used to cool the support 34 by conduction. The cooling system 24 will be a cryogenic system, in view of the low temperatures required to maintain the tape 18 in its superconducting state. The whole arrangement may optionally be surrounded by a thermally conducting atmosphere of helium gas (not shown).

When either embodiment of FIG. 2 or FIG. 3 is in use as a conductor element 16 of an FCL 10, as shown in FIG. 1, the element 16 will be in the superconducting state when no fault condition exists, so that substantially no current passes through the shunt resistor 14. In the event of a fault, excessive current will begin to flow. This quenches the superconducting element 18 to its normal conducting state. The total resistance provided by the superconducting element 18 is then greater than that of the shunt resistor 14, so that current then flows preferentially through the shunt resistor 14. This helps to reduce heating effects within the superconducting element 18, during fault conditions, thus preventing damage and facilitating recovery to the superconducting state, when the fault condition ends.

During normal conditions, the thermal mass 20 serves to maintain an even temperature throughout the superconducting element 18, maintaining the superconducting element 18 in a cooled condition, by virtue of the thermal connection between the thermal mass 20 and the superconducting element 18, and between the thermal mass 20 and the cooling system 24.

The thermal mass of a component is the product of volume of material with its volume specific heat at the temperatures of operation. Use of high conductivity material, such as silver or OFHC copper, at a temperature where its conductivity is significantly higher than at room temperature or temperatures typical of liquid nitrogen or liquid air systems, increases the distance that heat can travel in the rise time of the fault, which for a 50 Hz AC power system is typically taken as 5 milliseconds. More accurately: the characteristic thermal distance of heat transfer in a given time is linearly related to the square root of the thermal diffusivity.

The characteristic thermal distance does not require that only one material be considered: a sandwich or composite of several different materials has a characteristic heat transfer distance related to the individual thermal diffusivities of each material with a correction for the heat transfer coefficient between dissimilar materials.

In the current embodiments, additional thermal mass is positioned within distances less than three times the characteristic thermal distance for heat transfer. This improves fault initiation characteristics. This thermal mass contributes to preventing hotspots in the superconductor damaging the superconductor in non-faulted operation or as faults initiate or as they continue and terminate. The thermal mass is limited to allow the superconductor to quench to the non-superconducting state and thus to limit the fault current when a fault occurs.

In the current embodiments, additional thermal mass is positioned within distances less than three times the characteristic thermal distance. This improves the recovery time characteristics. This thermal mass is chosen to cool the superconductor thus restoring superconductivity in the superconductor and restoring usual operation.

In the current embodiments, the additional thermal mass is positioned within distances less than three times the characteristic thermal distance for heat transfer. This can maintain the low temperature and superconductivity in the superconducting element during failures or scheduled maintenance in the cooling system 24 and the FCL continues to operate both in non-fault and fault conditions.

These practical advantages arise from providing the material of the thermal mass 20 within a distance from the superconducting element of no more than three times the characteristic thermal distance.

Figure 4:
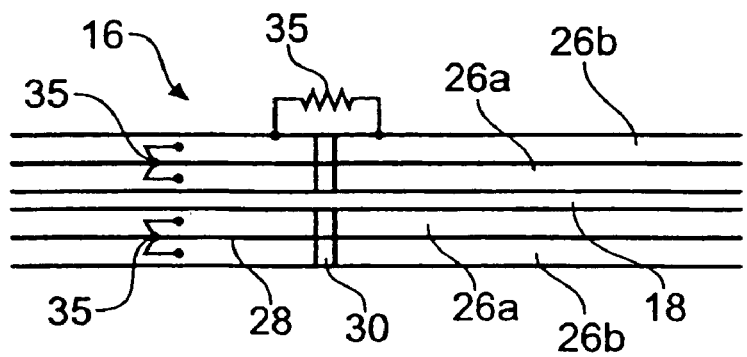
FIG. 4 is a schematic cross-section along the axis of a conductor element.

In addition to thermal contact being provided between adjacent bodies 26, controlled electrical connection may be provided, as illustrated schematically in FIG. 4. In this figure, each boundary between adjacent bodies 26, which are separated by insulating material, 28, 30 or 32, is bridged by a highly resistive resistor 35, for example 100,000 Ohms. These are provided between the bodies 26 to maintain an even voltage distribution during fault conditions.

Figure 5:
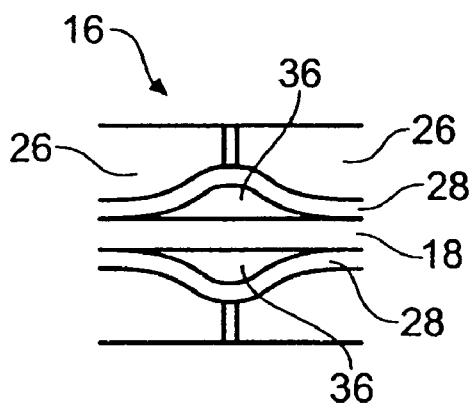
FIG. 5 is a schematic cross-section of the element of FIG. 2, in the vicinity of a boundary between bodies of the thermal mass.

In the arrangements described above, the most sensitive location in the superconducting element 18 is at the boundary between two bodies 26, at the insulating spacer. This is likely to be where the quench initiates as it will be warmer and thus the critical current will be lower. As a refinement to the design, the superconducting conductor has an additional electrically and thermally conducting shunt 36 (FIG. 5) directly attached to it at each such sensitive location, but electrically insulated from the bodies 26, to allow heat and electricity to flow outside the superconductor and thus to reduce the intensity of the sensitivity by providing more even temperature along the element 18.

This additional body 36 of thermally conducting material is preferably provided in thermal contact with the superconducting element 18 in the vicinity of each boundary between bodies 26, particularly between bodies 26a of the inner layer, to reduce the likelihood of hot spots occurring in the superconducting element at that vicinity, as a result of the locally reduced thermal conductivity of the thermal mass 20, arising from the presence of insulating material. Alternatively, this shunt may be provided as a sheath along the whole length of the superconducting element.

Various design parameters of the elements 16 described above can be varied within the scope of the invention. For example:

1. The length of superconductor element 18 can be increased for use in higher voltage systems, since doubling the working voltage requires an approximate doubling of the length.
2. The length of superconductor element 18 can be increased to reduce the total amount of heat produced during a fault event, since the resistive heating during the fault scales as the resistance of the rod. Thus doubling the length of the rod will approximately halve the amount of heat.
3. The length of superconductor element 18 can be increased to increase the resistance during fault and thus to reduce the magnitude of the fault current. The value of the external shunt resistance 14 also affects the current during fault.
4. The amount and conductivity of thermal mass material can be varied within limits set by the geometry to alter the recovery time.
5. The geometry of the superconductor can be varied to reduce the time to quench and the recovery time e.g. by reducing its transverse dimensions. Thinner superconductor wire or tape or similar, or a superconductor made from multiple superconducting filaments, will have a faster initiation and faster recovery, all other things being equal.
6. The properties of the superconducting material can be varied to increase the speed of the quench. In magnesium diboride based superconductors, over or under heat treatment can create partial weak links between grains which affect current carrying capacity very close to the critical temperature or when a magnetic field is applied. Analogous preparation for copper-oxide ceramic superconductors is possible. This is advantageous as it increases the speed of the quench. Thus, we propose intentionally degrading the superconducting properties. Traditional design is based on expensive superconductors where the best possible properties are desired to make the best use of the expensive materials.

In a specific device the parameters of length, thinness, internal and external shunt conducting material, applied magnetic field by coil design, thermal mass location and thermal connection, usual operating temperature and other geometric, material and electrical or magnetic parameters will be optimised for the desired operating voltage, current, quench time, recovery time, desired ratio of usual current to maximum fault current and cooling power required during non-fault operation and recovery.

The superconducting conductor may be a composite comprising a superconducting material, a non-superconducting electrical conductor as a shunt, and a mechanical container used in its manufacture.

The layers of electrical insulation may be applied as a paint or lacquer or other suitable method familiar to those skilled in the art.

The lengths of the bodies 26 may be similar to the thickness of the insulating material separating them in that the assembly resembles a stack of washers, alternately conducting and insulating.

The specific heat capacity and thermal conductivity of the bodies and of the electrical insulation 28, 30, 32 is designed to allow the superconducting element 18 to stop superconducting (to "quench") nearly adiabatically and thus to limit fault currents. However the specific heat capacity and thermal conductivity of the bodies and insulation is calculated to be sufficient to rapidly cool the superconductor back to a superconducting state when the fault is cleared.

It will be understood that when the superconductor quenches, it is not necessarily because it has been heated to above the critical temperature. The material will quench if the critical current is exceeded even if the material remains cold and below the critical temperature.

The bodies 26 are continuously cooled by direct thermal contact with a conducting cold body, such as the support 34, which may be a cold head of a cryogenic cooling system, and/or cooled by immersion in a gas or liquid such as Helium.

The remaining drawings illustrate preferred geometries for arranging the conductor elements described above.

Figure 6:
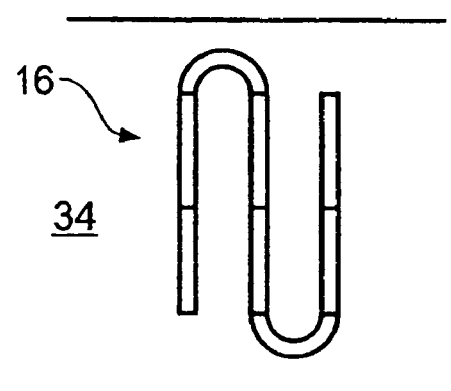
FIGS. 6 to 9 are highly schematic diagrams of various geometries in which conductor elements of the invention may be utilised in fault current limiters.

FIG. 6 illustrates a conductor element 16 arranged in serpentine manner across the surface of the support 34, thereby being in thermal contact with the cryogenic cooling system which cools the support 34. In particular, the structure of FIG. 3 can be arranged in this manner. The serpentine nature of the arrangement results in the arrangement being non-inductive or low inductance, which is desirable because the magnetic field experienced by the superconducting element 18 represents a further parameter which can cause the element to quench to a normal conducting state. Substantially neutralising magnetic effects in this manner, and providing thermal control in the manner described, results in the primary parameter for causing quenching being excessive current, and thus improves fault current limiting properties of the arrangement.

A specific example of the embodiment of FIG. 3 can be arranged in the manner of FIG. 6. In this example, magnesium diboride superconducting tape is used, comprising a core of magnesium diboride and an outer sheath of stainless steel. This tape is 4 mm wide and 0.25 mm thick. It is laminated with a copper foil on both sides to provide a current shunt extending the entire length and then painted with an insulating film of polymer lacquer.

Rectangular oxygen-free high conductivity (OFHC) copper rods, 5 mm thick, 10 mm wide and 250 mm long are prepared with a longitudinal shallow groove 0.25 mm deep and 4 mm wide along one face. The rods are lacquered and glued in pairs to the superconducting wire, abutting the next pair closely.

At the centre point of each rod pair, a carbon resistor of 100 kOhms connects the two rods. At the junction between pairs, another resistor of 100 kOhms connects successive rods. These are to ensure that voltage distribution along the device is uniform.

Every third pair of copper rods are bent into a semicircle so that the current follows a non-inductive zig-zag path. This is illustrated in FIG. 6.

For each pair of rods, another pair of identical dimensions but comprised of a lower purity grade of copper is affixed to them.

The copper rods are affixed to alternate flat and cylindrically curved sheets which are thermally connected to a cryocooler. The whole assembly is sealed, pressurised to 4 atm with Helium gas, placed in a vacuum flask and cooled to 20 K.

Figure 7:
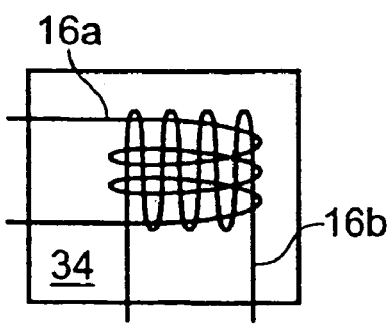

FIG. 7 illustrates several non-inductive serpentine elements 16a, 16b entwined. This improves the thermal uniformity of the arrangement, during use and also reduces the overall volume of the arrangement, which assists in reducing demand on the cryogenic cooling system 24. The entwined conducting elements 16 may be connected in parallel as a sub-module of an FCL, or all of the conductive elements 16 of an FCL (which will commonly be designed to accommodate a three phase supply) may be entwined in this manner.

Figure 8:
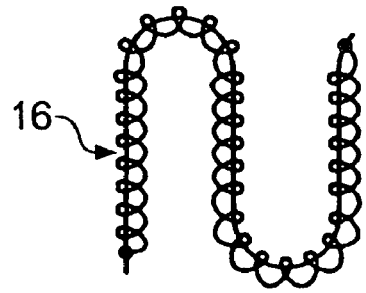

In FIG. 8, a conductive element 16 of the type described above, with a serpentine path, is shown with a coil coiled around it, the coil being itself a conducting element 16, generally of the type described above.

The coil and the central non-inductive assembly are connected in parallel. In non-faulted operation, the coil carries almost no current, as its reactance is significant whereas the non-inductive assembly has a very low reactance. When a fault occurs, the current in the central system destroys the superconductivity at a few initiating locations and a voltage appears at the ends of the affected rods or modules and at the ends of the system. A current then flows in the outer coil with a rise time limited by its inductance. The magnetic field created helps to create a uniform quench along the central superconductor by suppressing the superconductivity magnetically. The superconducting material grade in the central system is designed and treated to be particularly sensitive to magnetic fields.

The coils applying the magnetic field can be superconducting elements. This arises because superconductors, particularly those based on magnesium diboride, are now sufficiently cheap for this structure to be feasible.

Figure 9:
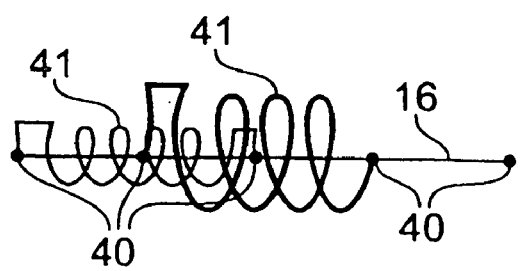

FIG. 9 illustrates a further example in which a straight, elongate conducting element 16 is formed in lengths delineated by points 40, between which various coils 41 are connected and coiled around the element 16. Each coil 41 extends along two sections of the element 16 and the coils overlap each other, so that each section (between adjacent points 40) has, coiled around it, at least two coils. If the whole of the conducting element 16 is constructed in this manner, with overlapping coils, a hot spot at any location will create a magnetic field covering both adjoining rods and thus result in a quench which propagates rapidly across the conducting element 16.

The superconducting element 18 has been described as elongate and it will be understood that many elongate or longitudinal geometries could be used, such as wires, tapes, strips etc.

Other temperature regimes could be used, particularly by careful design of the thermal diffusivity of the thermal mass 20, and the geometry of the superconducting element 18. For example, thin films of YBCO superconductor, covered by solid material of high thermal diffusivity, could be used.

In each of the examples described above, it can be seen that by forming the conducting element 16 by means of components in solid form, the conducting element 16 is "dry" and in particular, does not incorporate any cryogens. The thermal mass of the bodies 26 provides the function of maintaining even temperatures within the superconducting element 18, to avoid hot spots and to ensure good properties of fault limiting and recovery time. This function of maintaining even temperatures is addressed separately from the cooling requirement for removing heat, particularly after a fault condition. This requirement is provided by the cryogenic cooling system 24. The arrangements which provide these separate functions meet at the thermal connection provided by the support 34, in these examples. Accordingly, conventional cryogenic cooling systems can be used at 24, optimised for the working requirements, while retaining the benefits of the invention arising from the form of the conducting element 16. Providing a dry conducting element 16, without cryogens, makes the conducting element robust against problems associated with vibration, attitude, motion etc. Conventional cryogenic cooling systems which are robust against these problems are readily available and thus, the embodiments allow the formation of a complete FCL which is also robust.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A conductor element for a fault current limiter, comprising:
   a superconducting element which quenches to a normal conducting state when at least one of the current density and temperature is above a fault value; and
   a thermal mass in thermal contact with the superconducting element to absorb heat from the superconducting element to a sufficient thermal capacity to inhibit a quenching within a derived characteristic thermal distance of the thermal mass from the superconducting element;
   wherein the thermal mass is provided by at least two bodies in solid form associated with electrical insulation to inhibit continuous electrical conductivity at least longitudinally from one body to another body along the superconducting element through the bodies of the thermal mass;
   and wherein the conductor element further comprises a connection arrangement for providing, in use, thermal connection between the thermal mass and a cooling system on one side of the thermal mass away from the super conducting element to define a direct thermal path across the thermal mass.

2. An element according to claim 1, wherein the superconducting element is elongate, the body or bodies being located around the element.

3. An element according to claim 1, wherein the thermal mass comprises a plurality of bodies forming a plurality of layers around the superconducting element.

4. An element according to claim 2, wherein the or each layer of the mass comprises a plurality of bodies at respective positions around the element.

5. An element according to claim 2, wherein the or each layer of the mass comprises a plurality of bodies at respective positions along the element.

6. An element according to claim 3, wherein adjacent bodies of the thermal mass are in thermal contact.

7. An element according to claim 3, wherein a body of electrically insulating material is provided between adjacent bodies.

8. An element according to claim 3, wherein an additional body of thermally conducting material is provided in thermal contact with the superconducting element in the vicinity of boundaries between bodies of the thermal mass, to reduce the likelihood of hot spots occurring in the superconducting element at that vicinity.

9. An element according to claim 3, wherein resistors are provided between adjacent bodies to bridge the electrically insulating material.

10. An element according to claim 1, wherein the or at least one of the bodies is of copper.

11. An element according to claim 10, wherein at least one of the bodies is oxygen-free, high conductivity copper.

12. An element according to claim 1, wherein the thermal mass thickness is no more than three times the characteristic thermal distance.

13. An element according to claim 1, wherein the conductor element is arranged in serpentine manner across a surface which, in use, is in thermal contact with the cooling system.

14. An element according to claim 1, further comprising at least one coil connected in parallel with all or part of the superconducting element and coiled around the superconducting element.

15. An element according to claim 14, wherein the or each of the coils may be connected in parallel with a respective part of the length of the superconducting element.

16. A fault current limiter, comprising:
   1. connection terminals for connecting the limiter in circuit;
   2. a conductor element according to claim 1, connected between the connection terminals; and
   3. a cooling system which, in use, cools the thermal mass of the conductor element.

17. A limiter according to claim 16, further comprising a shunt resistance connected in parallel with the conductor element between the terminals and having a resistance lower than the conductor element when the superconducting element of the conductor is quenched.

* * * * *